United States Patent
Li et al.

(10) Patent No.: US 9,917,414 B2
(45) Date of Patent: Mar. 13, 2018

(54) MONOLITHIC NANOPHOTONIC DEVICE ON A SEMICONDUCTOR SUBSTRATE

(71) Applicant: International Business Machines Corporation, Armonk, NY (US)

(72) Inventors: Ning Li, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 14/800,235

(22) Filed: Jul. 15, 2015

(65) Prior Publication Data
US 2017/0018905 A1 Jan. 19, 2017

(51) Int. Cl.
| | |
|---|---|
| H01S 5/20 | (2006.01) |
| H01S 5/026 | (2006.01) |
| H01S 5/02 | (2006.01) |
| H01S 5/30 | (2006.01) |
| H01L 31/00 | (2006.01) |
| G02B 6/42 | (2006.01) |

(52) U.S. Cl.
CPC .............. *H01S 5/026* (2013.01); *H01S 5/021* (2013.01); *G02B 6/4202* (2013.01); *H01L 31/00* (2013.01); *H01S 5/3013* (2013.01); *H01S 2301/173* (2013.01)

(58) Field of Classification Search
CPC ........... H01L 21/823431; H01S 5/3013; H01S 5/2004; H01S 5/2045; H01S 5/24
See application file for complete search history.

(56) References Cited

U.S. PATENT DOCUMENTS

| | | | |
|---|---|---|---|
| 6,327,288 B1 * | 12/2001 | Wang | B82Y 20/00 |
| | | | 372/45.01 |
| 7,113,532 B2 | 9/2006 | Nagatake et al. | |
| 7,442,964 B2 | 10/2008 | Wierer, Jr. et al. | |
| 7,588,954 B2 | 9/2009 | Von Kaenel et al. | |
| 8,213,751 B1 | 7/2012 | Ho et al. | |
| 8,304,805 B2 | 11/2012 | Lochtefeld | |
| 8,384,196 B2 | 2/2013 | Cheng et al. | |
| 8,502,263 B2 | 8/2013 | Li et al. | |

(Continued)

FOREIGN PATENT DOCUMENTS

| | | |
|---|---|---|
| JP | 11-330093 | 11/1999 |
| JP | 2007-88132 | 4/2007 |

OTHER PUBLICATIONS

Goossen, K. W., et al., "GaAs MQW Modulators Integrated with Silicon CMOS", IEEE Photonics Technology Letters, Apr. 1995, vol. 7, No. 4, pp. 360-362.

*Primary Examiner* — Tuan Nguyen
(74) *Attorney, Agent, or Firm* — Scully, Scott, Murphy & Presser, P.C.; Louis J. Percello, Esq.

(57) ABSTRACT

A photonic light generating device is provided on a portion of a first semiconductor material. The photonic light generating device includes a second semiconductor material that has a different lattice constant than the lattice constant of the first semiconductor material and that is capable of generating and emitting light. The second semiconductor material of the photonic light generating device is present in a via opening that is provided into a waveguide core material and an underlying dielectric material. The via opening exposes a surface of the first semiconductor material.

15 Claims, 4 Drawing Sheets

(56) References Cited

U.S. PATENT DOCUMENTS

| | | | |
|---|---|---|---|
| 2008/0093622 A1* | 4/2008 | Li | H01L 21/02381 257/103 |
| 2008/0217639 A1 | 9/2008 | Kim et al. | |
| 2009/0067463 A1* | 3/2009 | Barwicz | H01L 27/1207 372/45.011 |
| 2015/0030047 A1* | 1/2015 | Cheng | H01S 5/1057 372/50.1 |
| 2016/0126418 A1 | 5/2016 | Kim et al. | |

* cited by examiner

MONOLITHIC NANOPHOTONIC DEVICE ON A SEMICONDUCTOR SUBSTRATE

BACKGROUND

The present application relates to semiconductor technology, and more particularly to a semiconductor structure including a photonic light generating device that is located on a semiconductor substrate and that can be readily integrated with other photonic devices as well as electronic devices on the same semiconductor substrate.

Integration of electronic (e.g., transistors, capacitors, resistors) and photonic (e.g., modulators, lasers, photodetectors, waveguides) devices on a single integrated chip using a standard semiconductor process has been actively pursued to provide fast optical communication links. Such integration, which may be referred to as a monolithic integration, has not been demonstrated for a high performance and stable photonic light emitting device, i.e., laser, on a Si substrate. In prior art monolithic integration, photonic light emitting devices are provided that have a large number of defects, and/or a high threshold current and/or a high energy consumption, and/or a low modulation speed. Moreover, prior art photonic light emitting devices are not compatible with complementary metal oxide semiconductor (CMOS) devices.

As such, there is a need for providing a monolithic integration scheme that is capable of providing a photonic light emitting device that overcomes all of the drawbacks mentioned above, yet exhibits high performance and good stability, on a portion of a semiconductor substrate, while maintaining other portions of the same semiconductor substrate for forming electronic devices as well as other photonic devices.

SUMMARY

A photonic light generating device is provided on a portion of a first semiconductor material. The photonic light generating device includes a second semiconductor material that has a different lattice constant than the lattice constant of the first semiconductor material and that is capable of generating and emitting light. The second semiconductor material of the photonic light generating device is present in a via opening that is provided into a waveguide core material and an underlying dielectric material. The via opening exposes a surface of the first semiconductor material. The second semiconductor material, which defines a portion of a laser element of the photonic light generating device of the present application, can exhibit a high modulation speed without requiring high energy consumption. The laser element is free of crystallographic defects because the size of the laser element (i.e., from 30 nm to 500 nm) is smaller than the grain sizes of the defective second semiconductor material that is grown on the lattice mismatched first semiconductor material.

In one aspect of the present application, a semiconductor structure is provided that includes a photonic light generating device located on a portion of a first semiconductor material having a first lattice constant. The photonic light generating device comprises a second semiconductor material having a second lattice constant that differs from the first lattice constant and that is capable of generating and emitting light. The second semiconductor material is located in a via opening that exposes a surface of the first semiconductor material. The via opening is surrounded by a material stack structure including, from bottom to top, a dielectric material structure and a waveguide core material structure.

In another aspect of the present application, a method of forming a semiconductor structure is provided that includes forming a material stack of, from bottom to top, a dielectric material portion and a waveguide core material portion on a surface of a first semiconductor material having a first lattice constant. Next, a via opening is formed entirely through the waveguide core material portion and the dielectric material portion. The via opening exposes a surface of the first semiconductor material. A second semiconductor material having a second lattice constant that differs from the first lattice constant and that is capable of generating and emitting light is thereafter epitaxially grown within the via opening.

DETAILED DESCRIPTION

Figure 1:
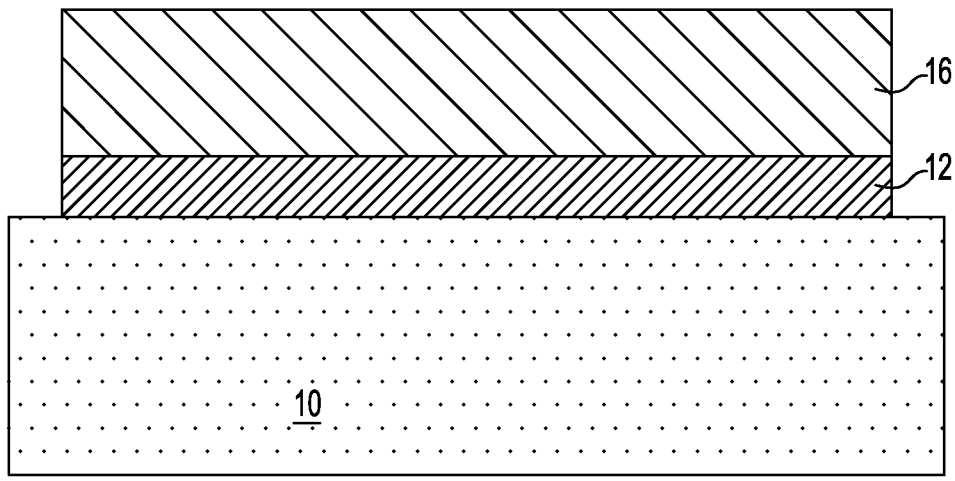
FIG. 1 is a cross sectional view of an exemplary semiconductor structure including a material stack of, from bottom to top, a dielectric material portion and a waveguide core material portion, which is located on a portion of a first semiconductor material having a first lattice constant and that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring now to FIG. 1, there is illustrated an exemplary semiconductor structure including a material stack of, from bottom to top, a dielectric material portion 12 and waveguide core material portion 16, which is located on a portion of a first semiconductor material 10 and that can be employed in accordance with an embodiment of the present application. The first semiconductor material 10 that is employed in the present application has a first lattice constant.

In one embodiment of the present application, the first semiconductor material 10 that can be used in the present application may be an upper portion of, or an entirety of, a bulk semiconductor substrate. By "bulk" it is meant that the entirety of the substrate is comprised of at least one semiconductor material. In another embodiment of the present application, the first semiconductor material 10 may be a topmost semiconductor material layer of a semiconductor-on-insulator substrate.

Notwithstanding which embodiment is employed, the first semiconductor material 10 comprises a semiconductor material such as, for example, Si, Ge, SiGe, SiC, SiGeC, and III/V compound semiconductors such as, for example, InAs, GaAs, or InP. In one embodiment, the first semiconductor material 10 is comprised of a silicon-containing semiconductor material including, but not limited to, pure, i.e., unalloyed, silicon, or a silicon alloy such as, for example, SiGe, SiC, and/or SiGeC. In one embodiment, the first semiconductor material 10 can be comprised of a single crystalline semiconductor material, such as, for example, single crystalline silicon.

In embodiments in which the first semiconductor 10 represents a topmost semiconductor material layer of a SOI substrate, the SOI substrate further includes a handle substrate (not shown), and an insulator layer (also not shown) located on an upper surface of the handle substrate; the first semiconductor material 10 is located on an uppermost surface of the insulator layer. In such an embodiment, the handle substrate provides mechanical support for the insulator layer and the first semiconductor material 10. The handle substrate and the first semiconductor material 10 that provide the SOI substrate may comprise the same, or different, semiconductor material. In one embodiment, at least the first semiconductor material 10 of the SOI substrate is a Si-containing layer such as, for example, unalloyed silicon or a silicon alloy such as, for example, SiGe, SiC, SiGeC. In some embodiments, the handle substrate is a non-semiconductor material including, for example, a dielectric material and/or a conductive material. In yet other embodiments, the handle substrate can be omitted and a substrate including an insulator layer (not shown) and the first semiconductor material 10 can be used in the present application.

The insulator layer of the SOI substrate may be a crystalline or non-crystalline oxide or nitride. In one embodiment, the insulator layer is an oxide such as, for example, silicon dioxide. In another embodiment, the insulator layer is a nitride such as, for example silicon nitride or boron nitride. In yet other embodiments, insulator layer is a multilayered stack of, in any order, silicon dioxide and boron nitride.

The SOI substrate may be formed utilizing standard processes including for example, SIMOX (separation by ion implantation of oxygen) or layer transfer in which two wafers are bonded together.

When an SOI substrate is employed, the thickness of the topmost semiconductor material layer of the SOI substrate that can be used as the first semiconductor material 10 can be from 10 nm to 100 nm. Other thicknesses that are lesser than, or greater than, the aforementioned thickness range may also be employed as the thickness of the topmost semiconductor material layer (i.e., the first semiconductor material 10) of the SOI substrate. The insulator layer of the SOI substrate can have a thickness from 5 nm to 200 nm. Other thicknesses that are lesser than, or greater than, the aforementioned thickness range may also be employed as the thickness of the insulator layer of the SOI substrate. The thickness of the handle substrate of the SOI substrate is inconsequential to the present application.

After providing the first semiconductor material 10, a material stack including the dielectric material portion 12 and the waveguide material portion 16 is then formed on a portion of the first semiconductor material 10 in which a photonic light generating device will be subsequently formed. That is, the material stack of the dielectric material portion 12 and the waveguide core material portion 16 is formed in a photonic light generating device region of the first semiconductor material 10.

The dielectric material portion 12 comprises any dielectric (i.e., insulator) material that has a lower reflective index and thus light permittivity than a waveguide core material to be subsequently formed. In one embodiment of the present application, the dielectric material portion 12 may be composed of a dielectric oxide. In such an embodiment, the dielectric oxide that provides the dielectric material portion 12 may comprise a semiconductor oxide such as, for example, silicon dioxide and germanium oxide. In some instances, the dielectric oxide that can provide dielectric material portion 12 may comprise a dielectric metal oxide. Examples of dielectric metal oxides that can be used as the dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2.

Other dielectric materials besides dielectric oxides that have a refractive index smaller than the waveguide core material can be used instead of a dielectric oxide material.

The dielectric material portion 12 can be formed by first providing a contiguous layer of the dielectric material (not shown) across the entire topmost surface of the first semiconductor material 10. In one embodiment of the present application, the contiguous layer of dielectric material may be formed by a deposition process. Examples of deposition processes that can be used in providing the contiguous layer of dielectric material include, for example, chemical vapor deposition (CVD), plasma enhanced chemical vapor deposition (PECVD), or atomic layer deposition (ALD). In other embodiments, the contiguous layer of dielectric material can be formed by a thermal oxidation process. In yet other embodiments, the contiguous layer of dielectric material can be formed by a combination of a deposition process and thermal oxidation. The thickness of the contiguous layer of dielectric material can range from 5 nm to 3000 nm. Other thickness that are lesser than, or greater than the aforementioned thickness range can also be employed as the thickness of the contiguous layer of dielectric material.

After forming the contiguous layer of dielectric material, a contiguous layer of a waveguide core material (not shown) can be formed atop the contiguous layer of dielectric material. A portion of the contiguous layer of waveguide core material provides the waveguide core material portion 16 shown in FIG. 1. The term "waveguide core material" is used throughout the present application to denote a material having a higher reflective index and thus light permittivity than the dielectric material that provides dielectric material portion 12.

In one embodiment of the present application, the contiguous layer of waveguide core material that provides the waveguide core material portion 16 is comprised of amorphous silicon. The term "amorphous" denotes that the silicon that provides the waveguide core material lacks any well defined crystal structure. In another embodiment of the present application, the contiguous layer of waveguide core material that provides the waveguide core material portion 16 is comprised of silicon nitride. In some embodiments, and when silicon nitride is used to provide the waveguide core material portion 16, the silicon nitride may have a silicon concentration of from 50% atomic percent to 80% atomic percent. Other silicon percentages can also be used in the present application.

The contiguous layer of waveguide core material that provides the waveguide core material portion 16 can be formed by a deposition process including, for example, chemical vapor deposition or plasma enhanced chemical vapor deposition. The thickness of the contiguous layer of waveguide core material can range from 20 nm to 3000 nm. Other thicknesses that are lesser than, or greater than, the aforementioned thickness range may also be employed in the present application.

The stack containing the contiguous layer of waveguide core material and contiguous layer of dielectric material is then patterned to provide the material stack of the dielectric material portion 12 and waveguide material portion 16 shown in FIG. 1. In one embodiment of the present application, patterning of the contiguous layers of waveguide core material and dielectric material can be performed by lithography and etching. Lithography includes forming a photoresist material (not shown) on the contiguous layer of waveguide core material. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the contiguous layer of waveguide core material. The pattern provided by the patterned photoresist material is thereafter transferred into the underlying contiguous layer of waveguide core material and contiguous layer of dielectric material utilizing at least one pattern transfer etching process. Typically, the at least one pattern transfer etching process is an anisotropic etch; the anisotropic etch provides a material stack in which the dielectric material portion 12 and the overlying waveguide core material portion 16 have sidewall surfaces that are vertically coincident to each other. In one embodiment, a dry etching process such as, for example, reactive ion etching can be used. In another embodiment, a chemical etchant can be used. In still a further embodiment, a combination of dry etching and wet etching can be used.

In some embodiments, the contiguous layer of dielectric material can be first formed and thereafter patterned by lithography and etching as defined above. A contiguous layer of waveguide core material then can be formed on exposed surfaces of the dielectric material portion 12. A separate patterning step may follow the formation of the contiguous layer of waveguide core material. In such an embodiment, the resultant waveguide core material portion 16 may have a width that is the same or different from the width of the underlying dielectric material portion 12. In one embodiment, the width of the waveguide core material portion 16 is greater than the width of the underlying dielectric material portion 12.

Figure 2:
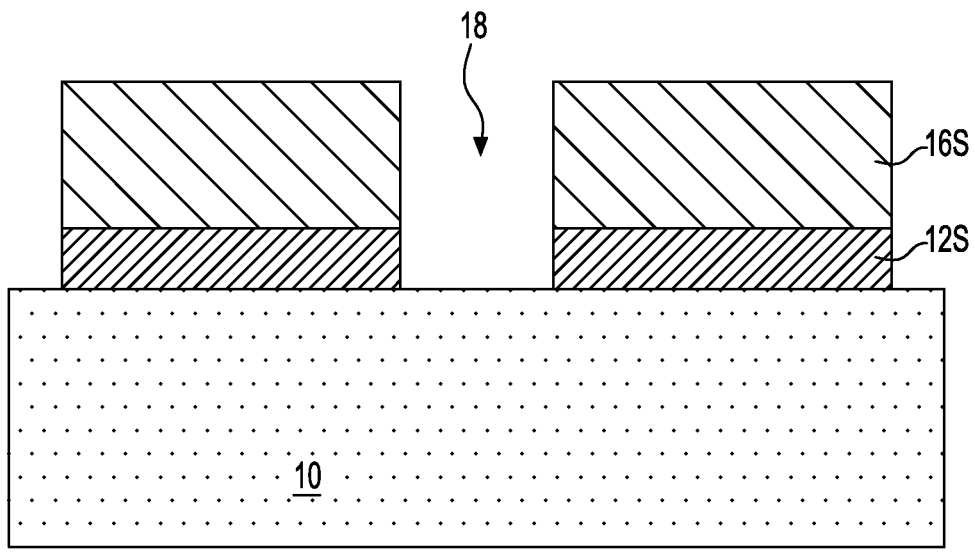
FIG. 2 is a cross sectional view of the exemplary semiconductor structure of FIG. 1 after forming a via opening extending entirely through the waveguide core material portion and the underlying dielectric material portion to expose a surface of the first semiconductor material.

Referring now to FIG. 2, there is illustrated the exemplary semiconductor structure of FIG. 1 after forming a via opening 18 that extends entirely through the waveguide core material portion 16 and the underlying dielectric material portion 12 to expose a surface of the first semiconductor material 10. The via opening 18 that is formed has a width that from 30 nm to 500 nm; the width of the via opening 18 will determine the width of the laser element of the photonic light generating device of the present application to be subsequently formed in the via opening 18. The height of the via opening depends on the thicknesses of the waveguide core material portion 16 and the underlying dielectric material portion 12. In one embodiment, the height of the via opening 18 is from 30 nm to 500 nm.

The via opening 18 can be formed by utilizing yet another patterning process. In one embodiment of the present application, lithography and etching as defined above, can be used to pattern the exemplary semiconductor structure of FIG. 1 and to provide via opening 18. In such an embodiment, a single etch or multiple etching steps may be used to provide the via opening. Following the formation of the via opening 18, a portion of the dielectric material portion 12 remains. The remaining portion of the dielectric material portion 12 can be referred to herein as a dielectric material structure 12S. Also following of the formation of via opening 18, a remaining portion of the waveguide core material portion 16 remains. The remaining portion of the waveguide core material portion 16 can be referred to herein as a waveguide core material structure 16S. Although the cross sectional views show the dielectric material structure 12S and the waveguide core material structure 16S as containing two discrete portions, the dielectric material structure 12S and the waveguide core material structure 16S are each a single piece that surrounds the entirety of the via opening 18. Collectively, the waveguide core material structure 16S and the underlying dielectric material structure 12S constitutes a material stack structure that surrounds, i.e., encloses, the via opening 18.

As is shown, the via opening 18 exposes a surface of the first semiconductor material 10 and the via opening is surrounded by a remaining portion of the waveguide core material portion and a remaining portion of the dielectric material portion.

Figure 3:
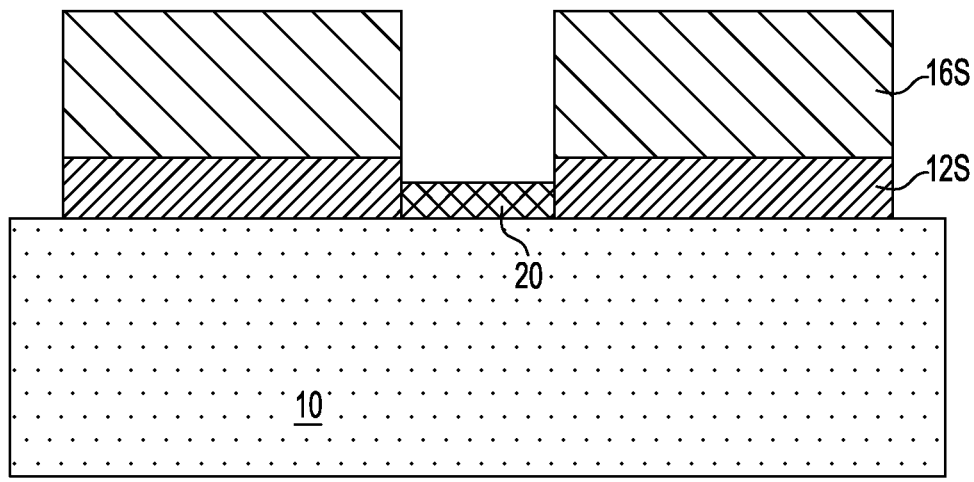
FIG. 3 is a cross sectional view of the exemplary semiconductor structure of FIG. 2 after forming a semiconductor material seed layer at the bottom of the via opening and on the exposed surface of the first semiconductor material.

Referring now to FIG. 3, there is illustrated the exemplary semiconductor structure of FIG. 2 after forming a semiconductor material seed layer 20 at the bottom of the via opening 18 and on the exposed surface of the semiconductor material 10. The semiconductor material seed layer 20 has a different lattice constant than the underlying growth surface of the first semiconductor material 10. In one embodiment, the lattice constant of the semiconductor material seed layer 20 is greater than the first lattice constant of the first semiconductor material layer. 10. In some embodiments (not shown), the semiconductor material seed layer 20 may be omitted.

The semiconductor material seed layer 20 includes any semiconductor material or stack of semiconductor materials that can facilitate the subsequent growth of a second semiconductor material 22 within the via opening 18. In one embodiment of the present application, the semiconductor material seed layer 20 is a III-V compound semiconductor material. The term "III-V" compound semiconductor material as used throughout the present application denotes a semiconductor material that includes at least one element from Group III (i.e., Group 13) of the Periodic Table of Elements and at least one element from Group V (i.e., Group 15) of the Periodic Table of Elements. Examples of Group III elements include B, Al, Ga, and/or In, while examples of Group V elements include N, P, As, and/or Sn. The range of possible formulae for III-V compound semiconductor material is quite broad because these elements can form binary (two elements, e.g., gallium arsenide (GaAs), ternary (three elements, e.g., indium gallium arsenide (InGaAs)) and quaternary (four elements, e.g. aluminum gallium indium phosphide (AlInGaP)) alloys.

The semiconductor material seed layer 20 is formed by a selective epitaxial growth (or epitaxial deposition) process. The terms "selective epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In the present application, the semiconductor material seed layer 20 has an epitaxial relationship, i.e., same crystal orientation, as that of the exposed surface of the first semiconductor material 10.

Examples of various epitaxial growth processes that are suitable for use in forming the semiconductor material seed layer 20 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking.

A number of different source gases may be used for the deposition of semiconductor material seed layer 20. In some embodiments, the source gas for the deposition of a III-V compound semiconductor seed material includes a mixture of an element III containing gas source and an element V containing gas source or a combined III-V source gas may be used. Carrier gases like hydrogen, nitrogen, helium and argon can be used.

The thickness of the semiconductor material seed layer 20 that can be formed is from 2 nm to 20 nm. Other thicknesses that are lesser than, or greater than, the aforementioned thickness range can also be employed in the present application. In one embodiment, and as shown, the semiconductor material seed layer 20 has a topmost surface that is located beneath a bottommost surface of the waveguide core material structure 16S and a bottommost surface that directly contacts the exposed portion of the surface of the first semiconductor material 10. The semiconductor material seed layer 20 also has sidewall surfaces that directly contact the dielectric material structure 12S.

Figure 4:
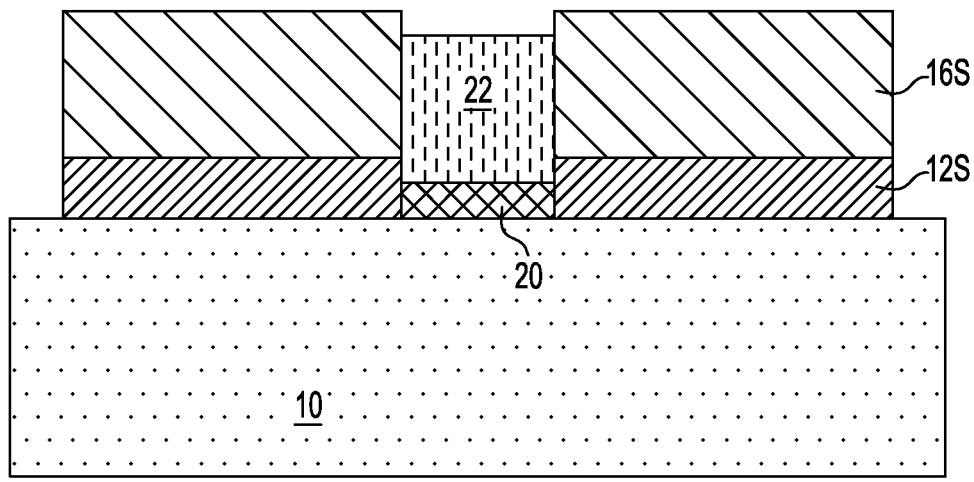
FIG. 4 is a cross sectional view of the exemplary semiconductor structure of FIG. 3 after forming a second semiconductor material having a second lattice constant that differs from the first lattice constant on the semiconductor material seed layer and within the via opening.

Referring now to FIG. 4, there is illustrated the exemplary semiconductor structure of FIG. 3 after forming a second semiconductor material 22 having a second lattice constant that differs from the first lattice constant on a surface of the semiconductor material seed layer 20 and within the via opening 18. The second lattice constant that defines the second semiconductor material 22 may be the same or different from the lattice constant of the semiconductor material seed layer 20. The second lattice constant that defines the semiconductor material layer 22 is typically greater than the first lattice constant of the first semiconductor material 10.

In addition to having a second lattice constant that differs from the first lattice constant, the second semiconductor material 22 includes any semiconductor material or semiconductor materials which upon excitation from an external source generates and emits light; the second semiconductor material 22 may be referred to herein as a light generating and light emitting semiconductor material. In one embodiment, the generation of light may be induced by providing a current to the second semiconductor material 22 utilizing an external voltage source. In one example, the second semiconductor material 22 may comprise a III-V compound semiconductor material or a multilayer of III-V compound semiconductors. In some embodiments, the second semiconductor material 22 comprises a multi-quantum well III-V compound material stack.

The second semiconductor material 22 is formed by a selective epitaxial growth (or epitaxial deposition) process. In embodiments in which the semiconductor material seed layer 20 is present, the second semiconductor material 22 forms directly on the semiconductor material seed layer 20. When the semiconductor material seed layer 20 is omitted, the second semiconductor material 22 is formed directly on the exposed surface of the first semiconductor material 10. The second semiconductor material 22 thus may have an epitaxial relationship with either the semiconductor material seed layer 20 or the exposed surface of the first semiconductor material 10.

The second semiconductor material 22 can be formed utilizing one of the epitaxial growth processes mentioned above in forming semiconductor material seed layer 20 including for example, metal-organic CVD (MOCVD). The temperature for epitaxial deposition of the second semiconductor material 22 can also range from 250° C. to 900° C. A number of different source gases may be used for the deposition of the second semiconductor material 22. In some embodiments, the source gas for the deposition of a III-V compound semiconductor material includes a mixture of an element III containing gas source and an element V containing gas source or a combined III-V source gas may be used. Carrier gases like hydrogen, nitrogen, helium and argon can be used.

In some embodiments, a timed epitaxial growth process can be used to provide the structure shown in FIG. 4. In another embodiment, and following the epitaxial growth of the second semiconductor material 22, an etch back process may be used to remove excess second semiconductor material 22 that extends above the via opening 18. The epitaxial growth of the second semiconductor material 22 may be performed with, or without, breaking a vacuum between the epitaxial growth of the semiconductor material seed layer 20 and the second semiconductor material 22.

The thickness of the second semiconductor material 22 that can be formed is from 10 nm to 50 nm. Other thicknesses that are lesser than, or greater than, the aforementioned thickness range can also be employed in the present application. In one embodiment, and as shown, the second semiconductor material 22 has a topmost surface that is located beneath a topmost surface of the waveguide core material structure 16S and a bottommost surface that directly contacts the exposed portion of the surface of the semiconductor material seed layer 20. The second semiconductor material 22 also has sidewall surfaces that directly contact a portion of the dielectric material structure 12S as well as a portion of a waveguide core material structure 16S. In some embodiments (not shown), the second semiconductor material 22 may have a topmost surface that is coplanar with a topmost surface of the waveguide core material structure 16S.

Figure 5:
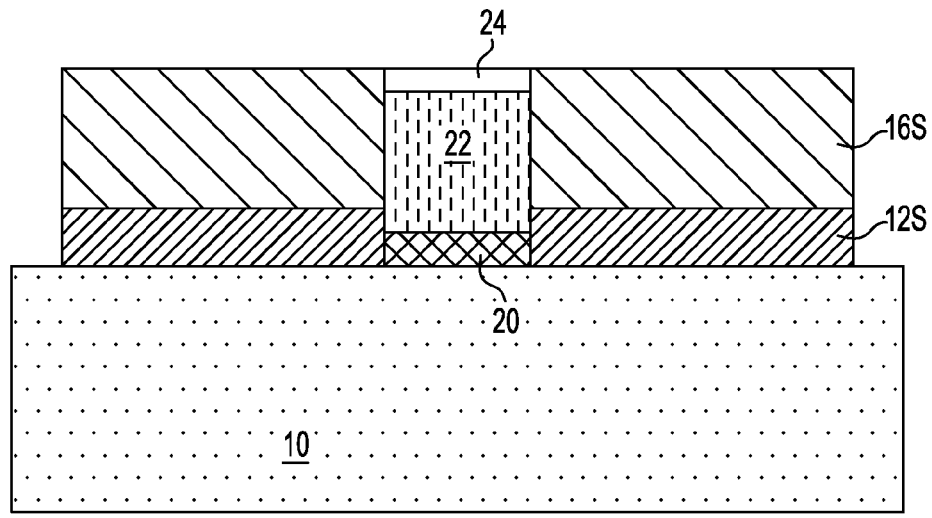
FIG. 5 is a cross sectional view of the exemplary semiconductor structure of FIG. 4 after forming a third semiconductor material having a third lattice constant on a surface of the second semiconductor material.

Referring now to FIG. 5, there is illustrated the exemplary semiconductor structure of FIG. 4 after forming a third semiconductor material 24 having a third lattice constant on a surface of the second semiconductor material 22. In some embodiments (not shown), the third semiconductor material 24 can be omitted. The third lattice constant of the third semiconductor material 24 may be the same or different (i.e., lesser than, or greater than) the second lattice constant of the second semiconductor material 22. The third lattice constant that defines the third semiconductor material layer 24 is typically greater than the first lattice constant of the first semiconductor material 10.

The third semiconductor material 24 may include one of the semiconductor materials mentioned above for the first semiconductor material 10; the third semiconductor material 24 may comprise a same as, or different semiconductor material from, the semiconductor material that provides the second semiconductor material 22. In one example, the third semiconductor material layer 24 may comprise a III-V compound semiconductor material or a multilayer of III-V compound semiconductors.

The third semiconductor material 24 is formed by a selective epitaxial growth (or epitaxial deposition) process directly on a surface of the second semiconductor material 22. The third semiconductor material 24 thus may have an epitaxial relationship with the second semiconductor material 22.

The third semiconductor material 24 can be formed utilizing one of the epitaxial growth processes mentioned above in forming semiconductor material seed layer 20 including, for example, metal-organic CVD (MOCVD). The temperature for epitaxial deposition of the third semiconductor material 24 can also range from 250° C. to 900° C. A number of different source gases may be used for the deposition of the third semiconductor material 24. In some embodiments, the source gas for the deposition of a III-V compound semiconductor material includes a mixture of an element III containing gas source and an element V containing gas source or a combined III-V source gas may be used. Carrier gases like hydrogen, nitrogen, helium and argon can be used.

In some embodiments and following the expitaxial growth process, an etch back process or a planarization process such as, for example, chemical mechanical planarization, may be used to remove excess third semiconductor material 24 that extends above the via opening 18. The epitaxial growth of the third semiconductor material 24 may be performed with, or without, breaking a vacuum between the epitaxial growth of the second semiconductor material 22 and the third semiconductor material 24.

The thickness of the third semiconductor material 24 that can be formed is from 5 nm to 10 nm. Other thicknesses that are lesser than, or greater than, the aforementioned thickness range can also be employed in the present application. In one embodiment, and as shown, the third semiconductor material 24 has a topmost surface that is coplanar with a topmost surface of the waveguide core material structure 16S and a bottommost surface that directly contacts the exposed portion of the surface of the second semiconductor material 22. The third semiconductor material 24 also has sidewall surfaces that directly contact a portion of a waveguide core material structure 16S.

In accordance with the present application, the optional semiconductor material seed layer 20, the second semiconductor material 22 and the optional third semiconductor material 24 constitutes components of a laser element that can generate and emit light upon excitation of at least the second semiconductor material 22. The laser element is free of crystallographic defects because the size of the laser element (i.e., from 30 nm to 500 nm) is smaller than the grain sizes of the defective second semiconductor material that is grown on the lattice mismatched first semiconductor material.

Also, and in accordance with the present application, the dielectric material structure 12S, the waveguide core material structure 16S, the optional semiconductor material seed layer 20, the second semiconductor material 22, and the optional third semiconductor material 24 constitute elements of a photonic light emitting device of the present application. In one embodiment of the present application, the first semiconductor material 10 includes silicon, while the semiconductor material seed layer 20, the second semiconductor material 22 and the third semiconductor material 24 each comprise a III-V compound semiconductor material. As is shown, the semiconductor material seed layer 20, the second semiconductor material 22 and the third semiconductor material 24 that constitute an embodiment of the laser element of the present application have sidewall surfaces that are vertically coincident to each other.

Figure 6A:
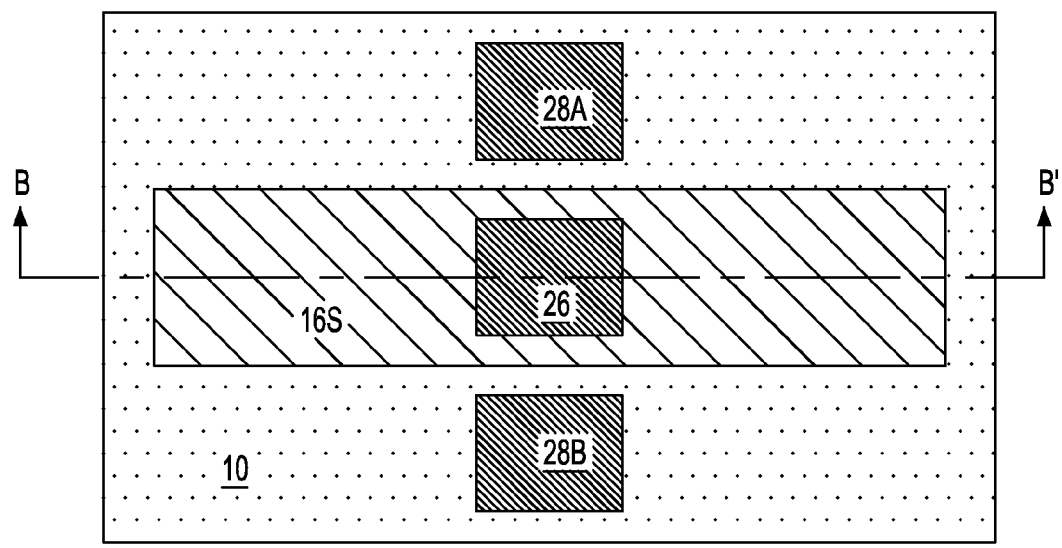
FIG. 6A is a top down view of the exemplary semiconductor structure of FIG. 5 after forming metal contacts.
Figure 6B:
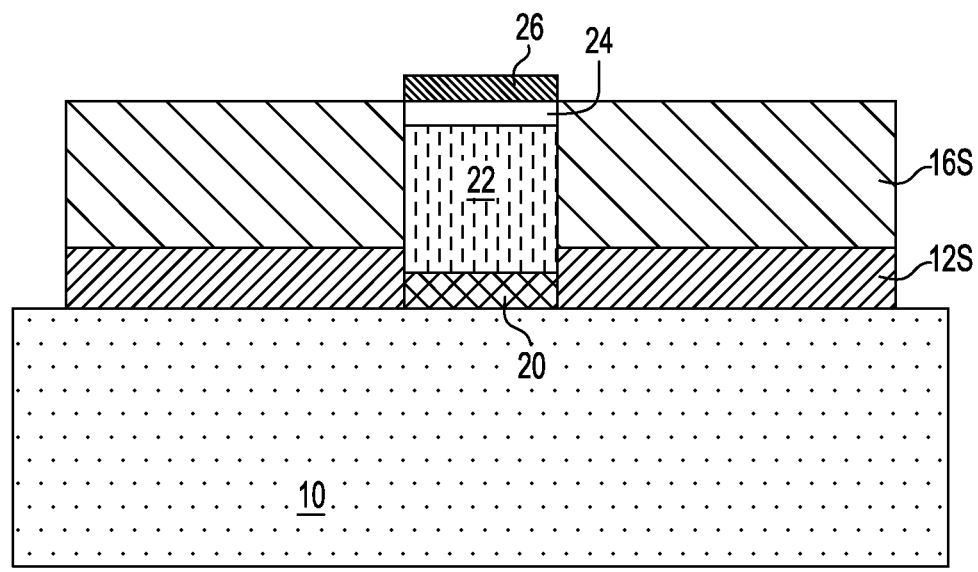
FIG. 6B is a cross sectional view of the exemplary semiconductor structure of FIG. 6A along vertical plane B-B'.

Referring now to FIGS. 6A-6B, there are illustrated various views of the exemplary semiconductor structure of FIG. 5 after forming metal contacts 26, 28A, 28B. As is shown, metal contact 26 contacts a topmost surface of the third semiconductor material 24, while the metal contacts 28A, 28B contact different portions of an exposed surface of the first semiconductor material 10 that lies adjacent the photonic light emitting device (12S, 16S, 20, 22, 24). Metal contacts 28A and 28B are spaced apart from the material stack structure (i.e., the waveguide core material structure 16S and the dielectric material structure 12S) of the present application.

Each metal contact 26, 28A, 28B can comprise a conductive metal or conductive metal alloy. Examples of conductive metals that can be used in providing the metal contacts includes, but are not limited to, tungsten (W), aluminum (AL), and/or copper (Cu). The metal contacts 26, 28A, 28B can be formed by deposition of a conductive metal or metal alloy, followed by patterning the deposited conductive metal or metal alloy by, for example, lithography and etching.

Although not shown, other portions of the first semiconductor material 10 can be processed (either before, during or after forming the photonic light emitting device of the present application) to include one or more electronic devices (e.g., transistors, capacitors, and/or resistors) as well as other photonic devices (e.g., modulators, photodetectors and waveguides). The one or more electronic devices and other photonic devices can be formed utilizing techniques well known to those skilled in the art and block mask technology can also be used to protect certain device regions, while processing other devices regions of the first semiconductor material 10. As such, the photonic light emitting device of the present application (12S, 16D, optional 20, 22, and optional 24) can be integrated with other electronic devices and other photonic devices on a same semiconductor substrate, i.e., the first semiconductor material 10).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a photonic light generating device located on a portion of a first semiconductor material having a first lattice constant, said photonic light generating device comprises a second semiconductor material having a second lattice constant that differs from the first lattice constant and that generates and emits light, said second semiconductor material is present in a via opening that is located in a material stack structure, said material stack structure comprises a dielectric material structure located directly on a topmost surface of the first semiconductor material and a waveguide core material structure located directly on a topmost surface of the dielectric material structure, wherein said waveguide core material structure comprises a waveguide core material that has a higher reflective index than a dielectric material that provides the dielectric material structure, and wherein said second semiconductor material is positioned between a semiconductor material seed layer having a lattice constant that differs from the first lattice and a third semiconductor material having a third lattice constant, said third semiconductor material is located on a surface of said second semiconductor material, and has a topmost surface that is coplanar with a topmost surface of said waveguide core material structure, and said second semiconductor material has sidewall surfaces, and wherein an upper portion of each sidewall surface of said second semiconductor material contacts a sidewall surface of said waveguide core material structure, and a lower portion of each sidewall surface of said second semiconductor material contacts a portion of said dielectric material structure.

2. The semiconductor structure of claim 1, wherein said first semiconductor material comprises silicon, and each of said semiconductor material seed layer, said second semiconductor material and said third semiconductor material comprises a III-V compound semiconductor material.

3. The semiconductor structure of claim 1, wherein said dielectric material structure comprises a dielectric oxide material.

4. The semiconductor structure of claim 1, wherein said waveguide core material structure comprises amorphous silicon or silicon nitride.

5. The semiconductor structure of claim 1, further comprising a metal contact located above a surface of said second semiconductor material.

6. The semiconductor structure of claim 5, wherein said metal contact is located on a surface of a third semiconductor material having a third lattice constant that differs from the first lattice constant, said third semiconductor material is located on a surface of said second semiconductor material.

7. The semiconductor structure of claim 5, further comprising other metal contacts located on a surface of said first semiconductor material and spaced apart from said material stack structure.

8. A method of fabricating a semiconductor structure, said method comprising:
    forming a material stack of, from bottom to top, a dielectric material portion and a waveguide core material portion, wherein said dielectric material portion is formed directly on a topmost surface of a first semiconductor material having a first lattice constant and said waveguide core material is formed directly on a topmost surface of said dielectric material portion, and wherein said waveguide core material portion comprises a waveguide core material that has a higher reflective index than a dielectric material that provides the dielectric material portion;
    forming a via opening entirely through said waveguide core material portion and said dielectric material portion, said via opening exposes a surface of said first semiconductor material;
    epitaxially growing a semiconductor material seed layer within said via opening and on said exposed surface of said first semiconductor material
    epitaxially growing a second semiconductor material having a second lattice constant that differs from the first lattice constant and that is capable of generating and emitting light within said via opening on said semiconductor material seed layer; and
    epitaxially growing a third semiconductor material having a third lattice constant that differs from the first lattice contact on a surface of said second semiconductor material, wherein third semiconductor material has a topmost surface that is coplanar with a topmost surface of said waveguide core material structure, and said second semiconductor material has sidewall surfaces, and wherein an upper portion of each sidewall surface of said second semiconductor material contacts a sidewall surface of said waveguide core material portion, and a lower portion of each sidewall surface of said second semiconductor material contacts said dielectric material portion.

9. The method of claim 8, wherein said via opening has a width from 30 nm to 500 nm.

10. The method of claim 8, wherein said forming said material stack comprises:
    forming a contiguous layer of said dielectric material on said first semiconductor material layer;
    forming a contiguous layer of said waveguide core material on said contiguous layer of said dielectric material; and
    patterning said contiguous layers of said waveguide core material and said dielectric material to provide said via opening that physically exposed a portion of said first semiconductor material layer.

11. The method of claim 8, wherein said first semiconductor material comprises silicon, and each of said semiconductor material seed layer, said second semiconductor material and said third semiconductor material comprises a III-V compound semiconductor material.

12. The method of claim 8, wherein said dielectric material portion comprises a dielectric oxide material.

13. The method of claim 8, wherein said waveguide core material portion comprises amorphous silicon or silicon nitride.

14. The method of claim 8, further comprising forming a metal contact on a surface of said third semiconductor material.

15. The method of claim 8, further comprising other metal contacts on a surface of said first semiconductor material and spaced apart from remaining portions of said dielectric material portion and said waveguide core material portion.

* * * * *